US012751341B2

(12) United States Patent
Uchiyama

(10) Patent No.: US 12,751,341 B2
(45) Date of Patent: Sep. 29, 2026

(54) SEMICONDUCTOR ASSEMBLIES WITH SYSTEM AND METHODS FOR ALIGNING DIES USING REGISTRATION MARKS

(71) Applicant: Micron Technology, Inc., Boise, ID (US)

(72) Inventor: Shiro Uchiyama, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/614,583

(22) Filed: Mar. 22, 2024

(65) Prior Publication Data

US 2024/0234378 A1 Jul. 11, 2024

Related U.S. Application Data

(62) Division of application No. 17/410,327, filed on Aug. 24, 2021, now Pat. No. 11,955,461.

(51) Int. Cl.
*H10W 90/00* (2026.01)
*H10W 46/00* (2026.01)
*H10W 95/00* (2026.01)

(52) U.S. Cl.
CPC .......... *H10W 90/00* (2026.01); *H10W 46/00* (2026.01); *H10W 95/00* (2026.01)

(58) Field of Classification Search
CPC ... H01L 25/0657; H01L 21/50; H01L 23/544; H10W 90/00; H10W 95/00; H10W 46/00
See application file for complete search history.

(56) References Cited

U.S. PATENT DOCUMENTS 6,049,974 A * 4/2000 Asanasavest .......... H10P 72/50 414/816
6,640,423 B1 * 11/2003 Johnson .......... H10P 72/0446 29/721
7,091,592 B2 * 8/2006 Chen .......... H01L 25/0657 257/737
2004/0126928 A1 * 7/2004 Kinsman .......... H01L 23/3114 257/E29.022
2008/0258313 A1 10/2008 Ali et al.
2009/0160065 A1 * 6/2009 Haba .......... H01L 25/0657 438/109
2013/0147035 A1 6/2013 Chen et al.
(Continued)

FOREIGN PATENT DOCUMENTS

CN 101681851 A 3/2010
CN 103426835 A 12/2013

OTHER PUBLICATIONS

Chinese Office Action received in CN App No. 202211011342.4 dated May 22, 2026, pp all.

*Primary Examiner* — Dale E Page
*Assistant Examiner* — Wilner Jean Baptiste
(74) *Attorney, Agent, or Firm* — Dorsey & Whitney LLP

(57) ABSTRACT

Semiconductor device assemblies having features that are used to align semiconductor dies, and associated systems and methods, are disclose herein. In some embodiments, a semiconductor device assembly includes substrate that has a top surface and an alignment structure at the top surface. A first die is disposed over the top surface of the substrate, and the first die has a first channel that extends between a top side and a bottom side of the first die. The first channel is vertically aligned with and exposes the alignment structure at the top surface of the substrate.

8 Claims, 10 Drawing Sheets

(56) References Cited

U.S. PATENT DOCUMENTS

| | | | | |
|---|---|---|---|---|
| 2013/0300004 | A1 | 11/2013 | Choi et al. | |
| 2014/0001441 | A1* | 1/2014 | Kim | H01L 21/31155 257/29 |
| 2015/0279787 | A1 | 10/2015 | Kim et al. | |
| 2017/0243855 | A1* | 8/2017 | Kim | H01L 25/0657 |
| 2023/0062701 | A1 | 3/2023 | Uchiyama | |

* cited by examiner

SEMICONDUCTOR ASSEMBLIES WITH SYSTEM AND METHODS FOR ALIGNING DIES USING REGISTRATION MARKS

CROSS-REFERENCE TO RELATED APPLICATION(S)

The present application is a divisional of U.S. patent application Ser. No. 17/410,327, filed Aug. 24, 2021, now issued as U.S. Pat. No. 11,955,461, the disclosure of which is incorporated herein by reference in its entirety.

TECHNICAL FIELD

The present technology is directed to semiconductor device packaging. More particularly, some embodiments of the present technology relate to structures and techniques for aligning dies in a die stack and/or on a substrate.

BACKGROUND

Semiconductor dies, including memory chips, microprocessor chips, logic chips, and imager chips, are typically assembled by mounting a plurality of semiconductor dies, individually or in die stacks, on a substrate. The mounted dies and die stacks are then encased in a polymeric material (e.g., a resin) in a wafer-level molding process.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically-stacked packages can be electrically coupled to each other and/or to a substrate via electrical connectors, interconnects, or other conductive structures. However, the semiconductor dies must be precisely aligned as they are stacked to ensure, at least, the communication between the dies and to prevent interference with electrical connectors and/or surrounding devices. A semiconductor package can include many stacks of dies, and a failure of alignment can lead to a failed die stack or a failed device.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Figure 1:
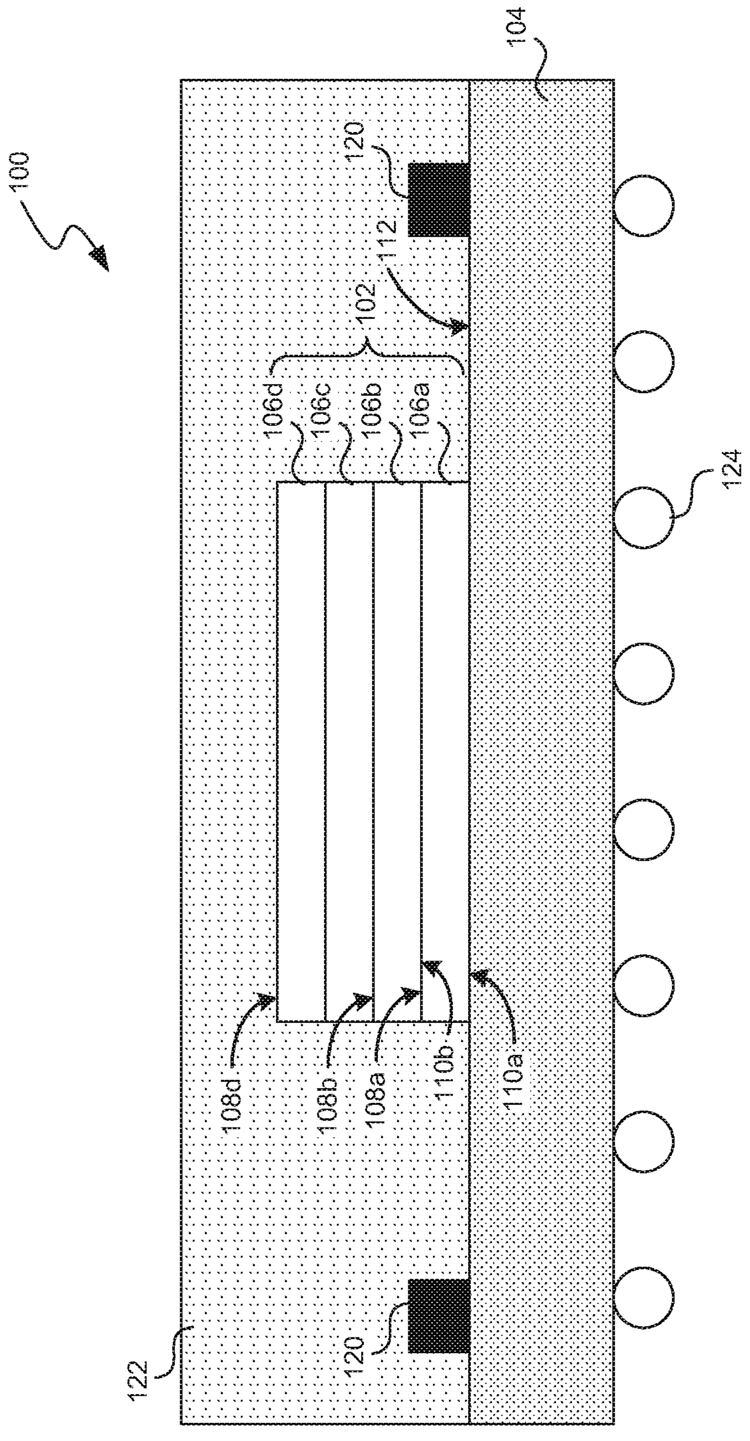
FIG. 1 is a side cross-sectional view of a semiconductor package configured in accordance with embodiments of the present technology.

Specific details of several embodiments for aligning dies in die stacks and on a substrate are described below. In some embodiments, for example, a semiconductor device assembly or package includes one or more dies in a die stack that have one or more channels. The channel can be located along an outer edge or an interior portion of the die and extends from a top side of the die to the bottom side of the die. The channel thus forms an open column (e.g., an opening, vertical channel, vertical path, etc.) that extends from the top to the bottom of the die. The channels can be formed using laser dicing, plasma etching, drilling, and/or other technologies capable of singulating dies. A technical advantage is realized as these technologies can singulate dies with non-uniform edges and form openings/holes through the dies. For example, plasma etching and/or laser dicing can form channels that are located along outer side edges of the dies and/or interior from the edges.

A technical advantage is realized as the channels can be used to optically align dies as they are stacked on each other to form a die stack. A first die can include at least one channel that aligns with a channel of a second die, and so on. Pairs of adjacent stacked dies can have channels that align with each other, but not with other dies. Improved alignment is realized when more than one channel is used to align adjacent dies.

A single die or a die stack can be optically aligned with a substrate (e.g., an organic printed circuit board, a package-level substrate, or a lower die in a stack of dies) by aligning the opening formed by the channel with an optically visible alignment structure on the substrate/lower die. In some embodiments, the lower die can be the bottom-most die in a die stack, while in other embodiments the lower die can be located within the die stack. The alignment structure can be any optically visible mark scribed and/or deposited on a top surface of the substrate/lower die. In other embodiments, the alignment structure can be a feature or component. An advantage is realized as the die, dies, and/or die stack can be optically aligned by viewing the alignment structure(s) through the open vertical channel(s). Optical alignment can be accomplished, for example, by using a camera apparatus or other appropriate imaging system that may be connected with or separate from the components that are physically aligning the dies, die stacks, and/or substrate.

A further technical advantage can be realized by including a protrusion that extends from a collet or other "pick and place". The protrusion can interface with a channel located on an outer edge of the die(s), or internal to the outer edge. The protrusion can improve alignment as the displacement and/or rotation between the die and the collet are known.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-9. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below", "top", and "bottom" can refer to relative directions or positions of features in the semiconductor devices in view of the orientation shown in the Figures. For example, "upper", "uppermost", or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 illustrates a side cross-sectional view of a semiconductor device assembly or package 100 configured in accordance with embodiments of the present technology. The package 100 includes a die stack 102 mounted on a package substrate 104 or surface. The die stack 102 includes a plurality of vertically-stacked semiconductor dies 106*a-d*. The dies 106 can be arranged to be in vertical alignment as shown. In other embodiments, the dies 106 can be arranged in a shingled or stepped configuration in which one or more die 106 is offset horizontally from the die 106 below, such as to allow for electrical interconnections. Although FIG. 1 depicts the die stack 102 as including four dies 106*a-d*, in other embodiments, the die stack 102 can include fewer or more dies 106 (e.g., one, two, three, five, six, seven, eight, nine, ten, or more dies 106).

Each of the dies 106 has a top side 108 and a bottom side 110. The bottom side 110*a* of the die 106*a* can be mounted, via die attach film, solder interconnects, or other suitable techniques, to a top surface 112 of the substrate 104. The bottom side 110*b* of the die 106*b* can be mounted to the top side 108*a* of the die 106*a*, and so on to form the die stack 102. In some embodiments, the die stack 102 can be formed on the substrate 104. In other embodiments, the die stack 102 can be formed separately from, and then attached to, the substrate 104. The dies 106 of the die stack 102 can be aligned with respect to each other and with the substrate 104 as discussed below in FIGS. 5 and 7.

Optionally, the package 100 can include surface-mounted components 120 such as capacitors, resistors, inductors, and/or other circuit elements. The package 100 can include other die stacks (not shown). Though not shown, additional layer(s) and/or components may be mounted on the die stack 102 and/or open areas of the substrate 104. For clarity, electrical connections, controllers, and the like are not shown.

The package 100 can further include a mold material or encapsulant 122 formed over at least a portion of the package substrate 104 and/or at least partially around the die stack 102. The mold material can be a resin, epoxy resin, silicone-based material, polyimide, or any other material suitable for encapsulating and protecting the components from contaminants and/or physical damage.

The dies 106 can each include a semiconductor substrate (e.g., a silicon substrate, a gallium arsenide substrate, an organic laminate substrate, etc.). In some embodiments, the dies 106 each include a front and/or active surface having various types of semiconductor components. For example, the dies 106 can each have memory circuits (e.g., dynamic random-access memory (DRAM), static random-access memory (SRAM), flash memory (e.g., NAND, NOR), or other type of memory circuits), controller circuits (e.g., DRAM controller circuits), logic circuits, processing circuits, circuit elements (e.g., wires, traces, interconnects, transistors, etc.), imaging components, and/or other semiconductor features. In some embodiments, the dies 106 can each be arranged in a "face-up" configuration with their front surfaces oriented upward and away from the package substrate 104. In other embodiments, however, one or more of the first dies 106 can be in a "face-down" configuration with their front surfaces oriented downward and toward the package substrate 104. Optionally, one or more of the dies 106 can be a "blank" substrate that does not include semiconductor components and that is formed from, for example, crystalline, semi-crystalline, and/or ceramic substrate materials, such as silicon, polysilicon, aluminum oxide ($Al_2O_3$), sapphire, and/or other suitable materials.

The package substrate 104 can be or include an interposer, a printed circuit board, a dielectric spacer, another semiconductor die (e.g., a logic die), or another suitable substrate. In some embodiments, the package substrate 104 includes additional semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). The package substrate 104 can further include electrical connectors 124 (e.g., solder balls, conductive bumps, conductive pillars, conductive epoxies, and/or other suitable electrically conductive elements) electrically coupled to the package substrate 104 and configured to electrically couple the package 100 to an external device (not shown).

Figure 2B:
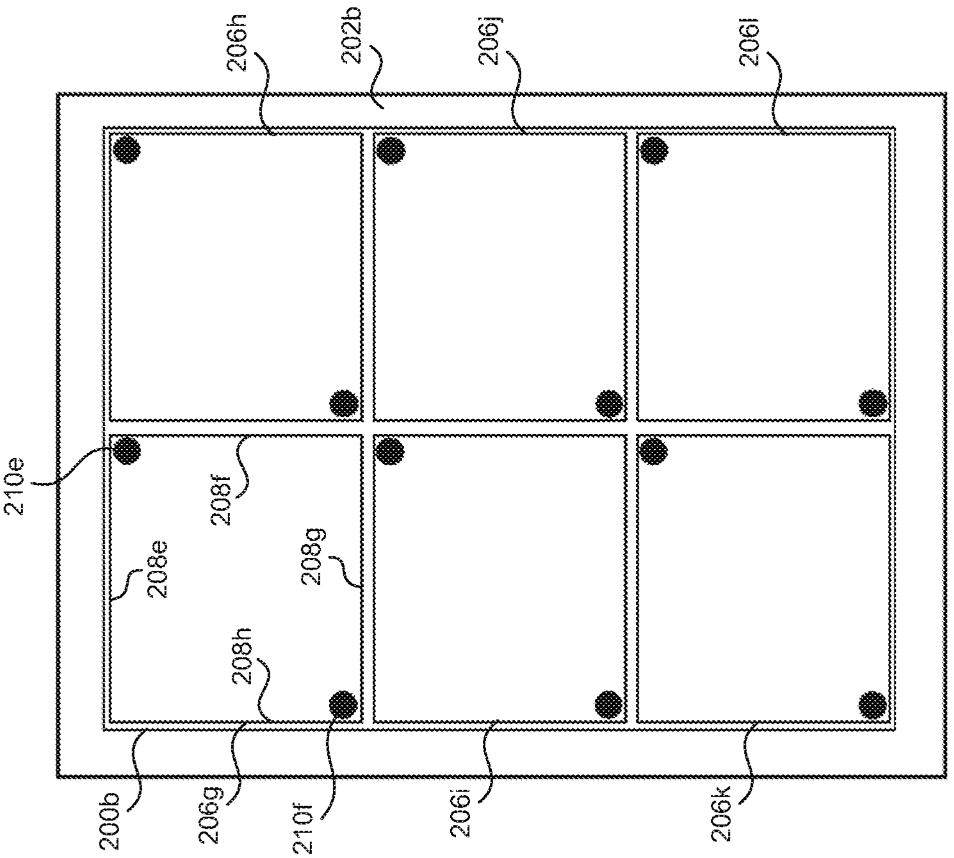
FIGS. 2A and 2B illustrate reticles that include a plurality of mask patterns that each correspond to a die in a larger sheet of material in accordance with embodiments of the present technology.
Figure 2A:
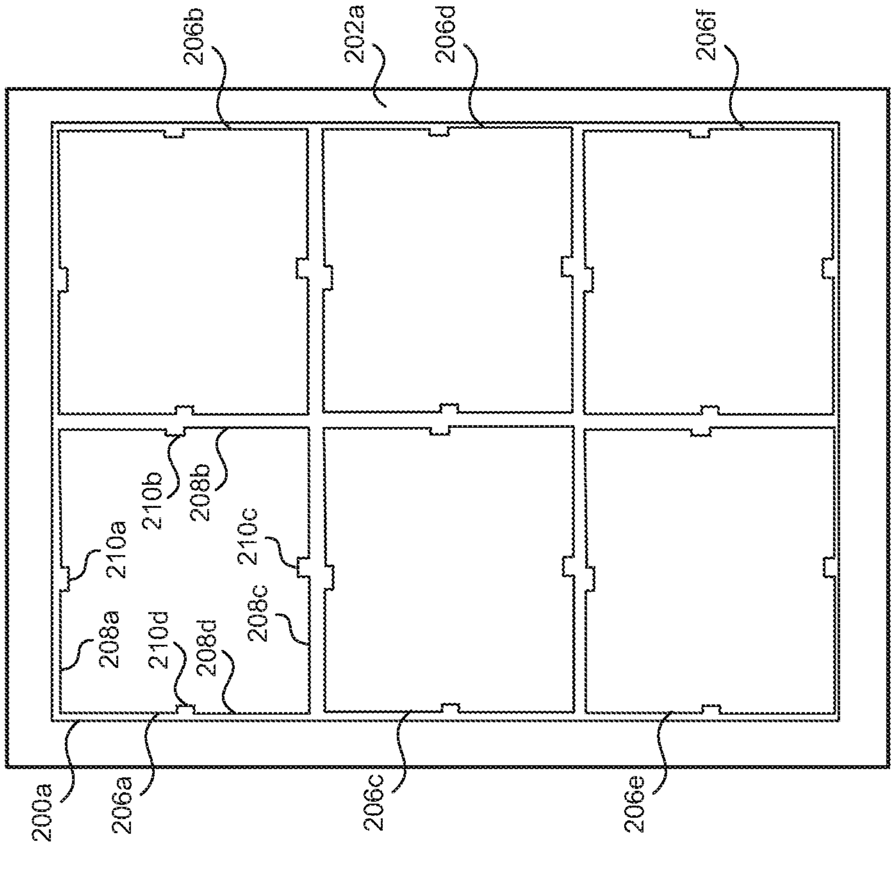

FIGS. 2A and 2B show reticles 200*a* and 200*b* that include a plurality of mask patterns that each correspond to a die in a larger sheet of material in accordance with embodiments of the present technology. The reticle 200 can be held by frame 202 applicable for use during the masking process. Other mask patterning apparatus can be used. In some embodiments, a photolithography stepper can be used. A mask pattern 206 defines the outer edges of each die 106. In the example shown in FIG. 2A, the reticle 200*a* has mask patterns 206*a-f* corresponding to six dies 106 that are adjacent to each other in die regions (e.g., forming a grid pattern) in a wafer (not shown). Similarly, in FIG. 2B the reticle 200*b* has mask patterns 206*g-l* that correspond to six dies 106 in the wafer. In other embodiments, the wafer can include less or more than six dies 106, and thus the reticle 200 would have a corresponding number of mask patterns 206.

The mask pattern 206*a* defines outer edges 208*a-d* of the die 106 that are unique, non-uniform, and/or non-linear, thus corresponding to a non-rectangular plan shape. A channel 210*a* that extends inwardly toward an interior portion of the die 106 is formed as a notch, recess, and/or recession in the outer edge 208*a*. Each of the outer edges 208*b-d* are also shown with a channel 210*b-d*. In this example the channels 210*a-d* are substantially rectangular. However, other shapes such as square, curved, triangular, a combination of irregular shapes, etc., can be used. In other embodiments, the channel 210*a* can be formed as a protrusion that extends outwardly from the interior portion of the die 106. In some embodiments the interior portion of the die 106 can include all areas of the die 106 inside of the outer edges 208 or a subset of the area inside the outer edges 208.

In FIG. 2B, the mask pattern 206*g* can include channels 210*e-f* that are positioned interior with respect to the outer edges 208*e-h* of the die 106. In this example, the channels 210*e-f* are substantially circular; however, other shapes such as square, triangular, openings with more than three sides, and/or a combination of curved and straight edges, etc., are contemplated. Also, the channels 210 can be located proximate a corner of the die 106 as shown, anywhere along one of the outer edges 208, and/or within the interior portion of the die 106.

In FIG. 2A, four channels 210 are associated with each die 106, while in FIG. 2B two channels 210 are associated with each die 106. However, each mask pattern 206 and corresponding die 106 can include one channel 210, three channels 210, or more than four channels 210. In some cases, using increasing numbers of channels 210 can improve accuracy when aligning the dies 106 in a die stack 102 or positioning them on the substrate 104. For example, a single channel 210 may provide linear displacement accuracy within an X-Y plane, while a second channel 210 can improve rotational alignment accuracy. A greater number of channels 210 can further improve the degrees of accuracy.

Figure 2C:
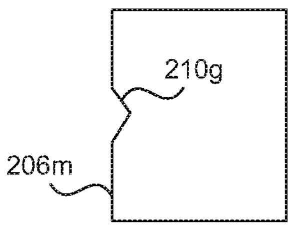
FIGS. 2C-2F show examples of different mask patterns in accordance with embodiments of the present technology.
Figure 2D:
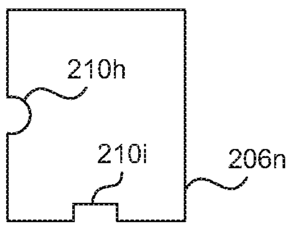
Figure 2E:
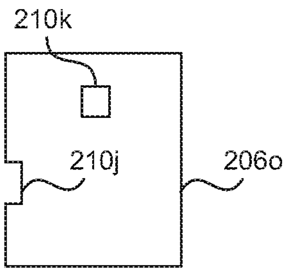
Figure 2F:
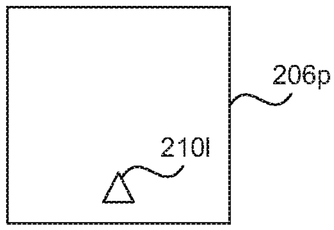

The channels 210 can be positioned anywhere along the outer edges 208 and/or anywhere interior with respect to the edges 208 of the die 106. FIGS. 2C-2F show different embodiments of the mask pattern 206, some of which correspond to non-rectangular plan shapes. FIG. 2C shows a mask pattern 206 with a single channel 210*g*. In this example, the channel 210*g* has two sides that form a triangular recess or indentation along one edge 208. FIG. 2D shows a mask pattern 206*n* that has two channels 210*h-i* on different edges 208. Therefore, the channels 210 are laterally spaced from each other. One of the channels 210*h* is curved (e.g., rounded, semi-circle) while the channel 210*i* has three sides. In some embodiments, the two channels 210 could be located along the same edge 208. FIG. 2E shows a mask pattern 206*o* that has a channel 210*j* located along one edge 208 and a second channel 210*k* located in an interior area of the die 106. FIG. 2F shows an example of a mask pattern 206*p* that has one channel 210*l* that is located in the interior area of the die 106. As with the other examples, the channels 210 can be any shape. The use of the channels 210 of FIGS. 2A-2F during alignment while building the die stack 102 and while mounting the die 106 and/or die stack 102 on the substrate 104 will be discussed further below in FIGS. 5 and 7.

Figure 3:
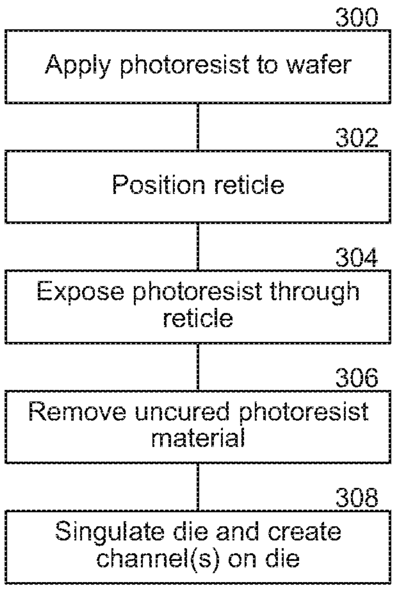
FIG. 3 is a flow chart of a method for singulating dies that have at least one channel in accordance with embodiments of the present technology.

FIGS. 2A and 2B will be discussed together with FIG. 3, which is a flow chart of a method for singulating dies that have at least one channel 210 in accordance with embodiments of the present technology. The method includes applying a photoresist material to a surface of a wafer that includes one or more dies 106 (box 300). The photoresist material provides a coating over the surface of the wafer (e.g., substrate, panel, etc.). The photoresist material is light-sensitive, and can be any known material used in the art.

Next, the reticle 200 is positioned to form the mask pattern 206 on the wafer (box 302). The photoresist material on the wafer is then exposed to ultraviolet light through the reticle 200 (box 304). Other wavelengths of light can be used. The mask pattern 206 blocks light from some areas of the wafer while allowing light to pass through and expose the photoresist material in other areas of the wafer. In some embodiments, the majority of the area of the reticle 200 (and the mask patterns 206) is clear or generally clear, allowing light to pass through the reticle 200. The lines that define the mask pattern 206 are opaque, or substantially light blocking, to prevent the passage of light. In this example, the light would cure (e.g. harden) a photoresist material that extends over the majority of the surface of the dies 106. In other embodiments, a photoresist material can be used that is degraded by the light, and thus the lines that define the mask pattern 206 would pass light and the light would be blocked from exposing the majority of the surface of the dies 106. In some embodiments, the reticle 200 is moved to one or more different areas of the wafer to expose other dies 106. In other embodiments, multiple reticles 200 may be used to expose the wafer with different patterns.

Uncured photoresist material can be removed (box 306), such as with a developer. The cured photoresist remains in place during the plasma etching or other appropriate singulation process.

The dies 106 in the wafer can be singulated and the channels 210 can be created (box 308) using laser dicing, plasma etching, drilling, and/or other technology capable of non-linear cutting and forming holes in the die 106. The channels 210 extend between the top side 108 and the bottom side 110 of the die 106. In some embodiments, die regions (not shown) encompassing the dies 106 can be separated from each other and then the non-uniform outer edges 208 and/or interior holes (e.g., channels 210*e, f, k, l*) can be formed. In other embodiments, when the channels 210 are located along the outer edges 208 (e.g., channels 210*a-d, g-j*), each die 106 may be singulated by laser dicing and/or plasma etching along the outer edges 208 defined by the mask pattern 206.

Figure 4A:
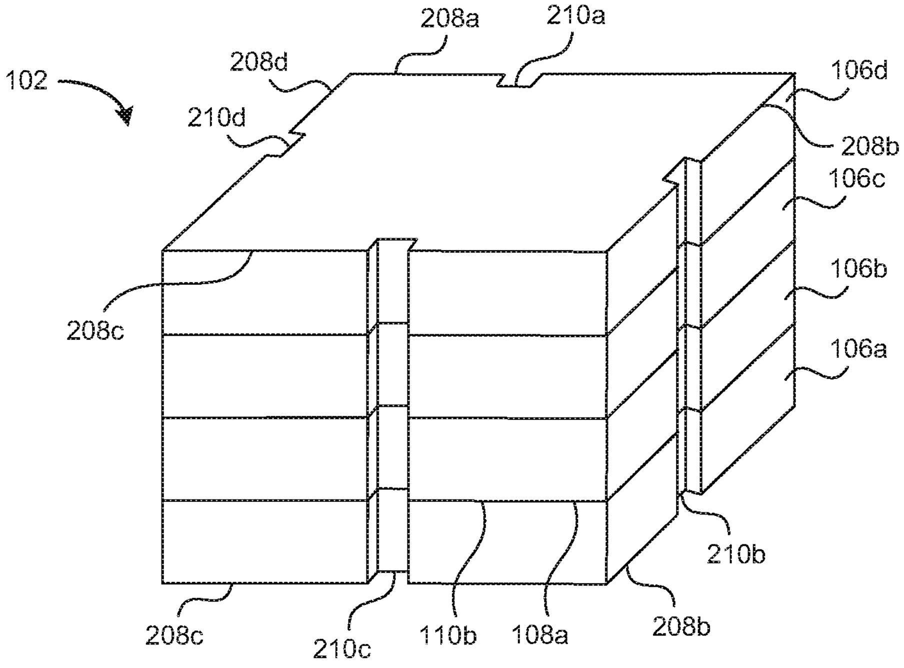
FIGS. 4A and 4B show isometric views of a die stack that was aligned using at least one channel in accordance with embodiments of the present technology.
Figure 4B:
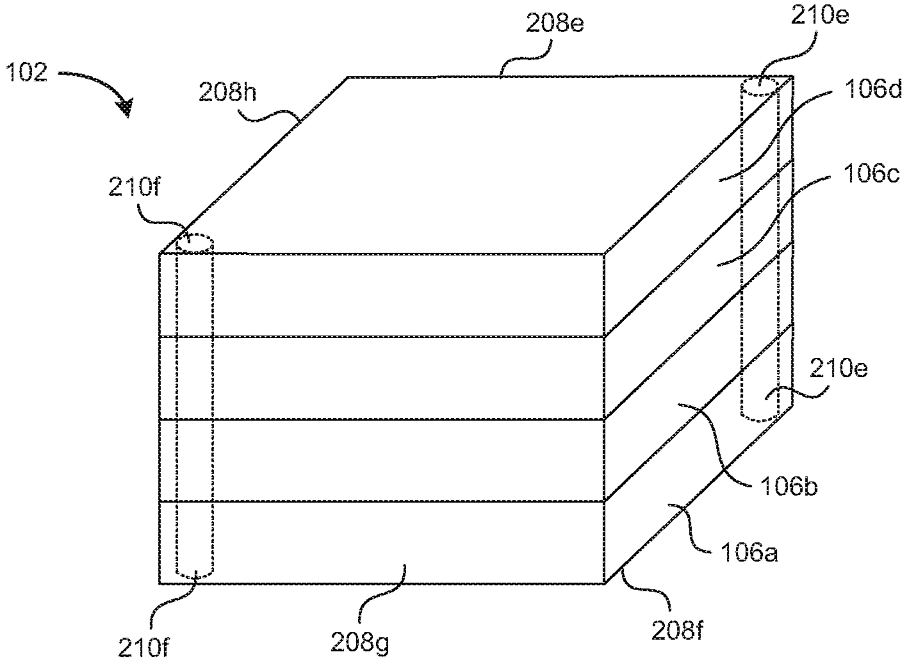

FIGS. 4A and 4B show isometric views of the die stack 102 (e.g., semiconductor device assembly) in accordance with embodiments of the present technology. In FIG. 4A, the die stack 102 includes dies 106 that have channels 210 similar to those described in relation to FIG. 2A (e.g., non-rectangular plan shapes, channels 210 that are laterally spaced from each other, etc.), while in FIG. 4B, the die stack 102 includes dies 106 that have channels 210 similar to those described in relation to FIG. 2B, wherein the channels 210 are also laterally spaced from each other.

Figure 5:
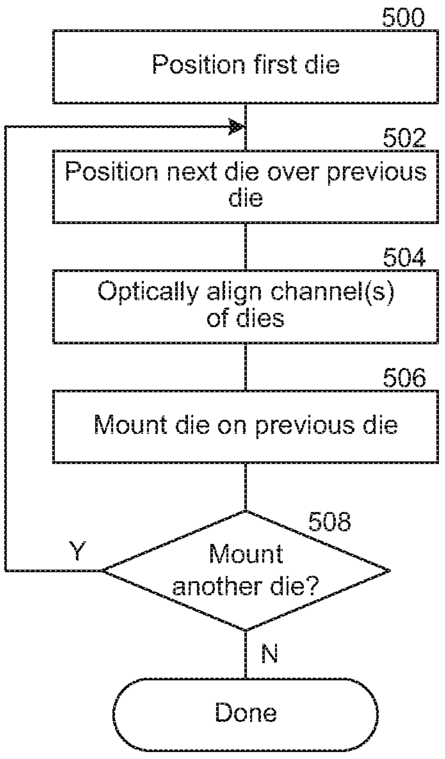
FIG. 5 is a flow chart of a method for using one or more of the channels to align the dies in the die stack in accordance with embodiments of the present technology.

FIGS. 4A and 4B will be described together with FIG. 5 below, which is a flow chart of a method for using the channel(s) 210 of the dies 106 to align the dies 106 in a die stack 102 in accordance with embodiments of the present technology. The singulated first die 106*a* can be initially positioned (box 500). For example, a die collet (discussed further below with respect to FIG. 8) using vacuum suction or a pick up tool can be used to pick the first die 106*a* and position it where the die stack 102 will be formed. The second die 106*b* can be picked up and positioned so that the bottom side 110*b* is over, but not touching, the top side 108*a* of the first die 106*a* (box 502).

An optical alignment tool or optical inspection tool, such as a camera, can be used to optically align the first and second dies 106 based on the alignment of one or more channels 210 (box 504). In other embodiments, physical alignment may be used, instead of or together with, optical alignment, such as by physically interfacing a protrusion, pin, or other physical element with corresponding channels 210 of the interfacing dies 106. The optical alignment tool and protrusion that interfaces with a channel 210 is discussed further below in FIG. 8. In some embodiments, the alignment can be a vertical alignment that exposes the open area of the channel 210 in the lower die 106 (e.g., non-linear edge of the die 106) that is directly below the upper die 106 that is being positioned/repositioned. The exposed area of the die(s) 106, whether they are non-linearities along an edge or interior to the die 106, can be filled or partially filled by molding material when the package 100 is encapsulated.

Once the first and second dies 106*a-b* are optically aligned, the second die 106*b* is placed/mounted on the first die 106*a* (box 506). In some embodiments, the first and second dies 106 are electrically and mechanically interconnected (e.g., by solder reflow, physical pressure, etc.), while in other embodiments, the dies 106 are interconnected after all of the dies 106 have been added to the die stack 102.

If another die 106 is to be added to the die stack 102 (box 508), the flow returns to box 502, and the next die 106 is positioned over the previous die 106 (e.g., die 106*c* is positioned over die 106*b*). The one or more channels 210 are optically aligned with corresponding channel(s) of at least the next-lower die 106 in the die stack 102 (box 504) and mounted to the top side 108 of the previous die 106 (box 506). Therefore, the channels 210 form open columns (e.g., an opening, vertical channel, vertical path, etc.) that can extend from the top to the bottom of the dies 106, or in some cases, extend partially though the die stack 102. In the examples shown in FIGS. 4A and 4B, the channels 210 extend from the top to the bottom of the die stacks 102.

Figure 6A:
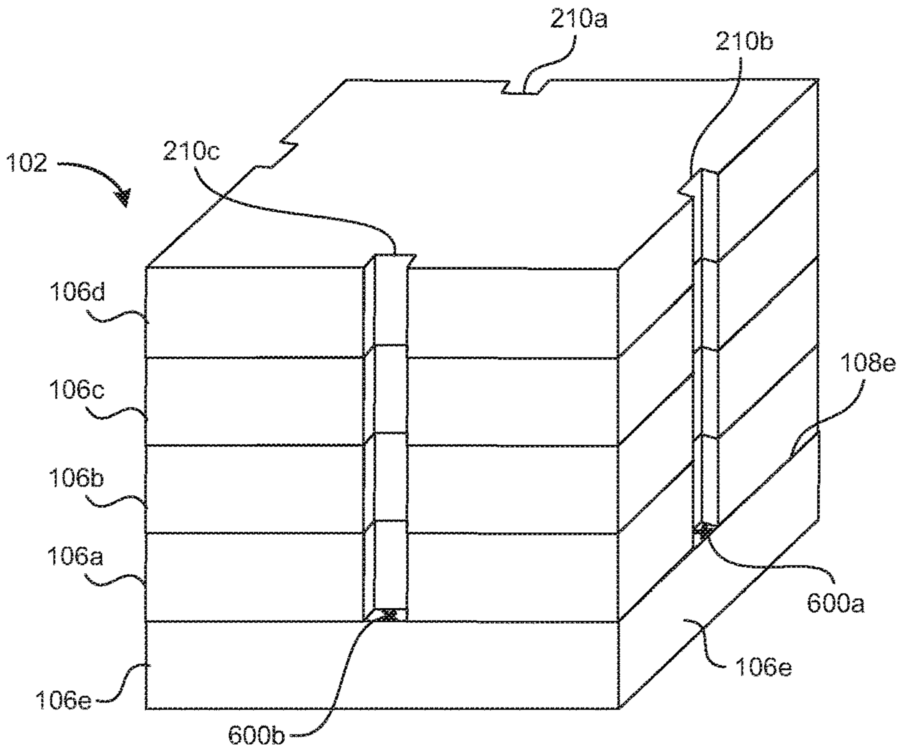
FIGS. 6A and 6B show the die stack aligned with a bottom-most die or a substrate that has at least one alignment structure in accordance with embodiments of the present technology.
Figure 6B:
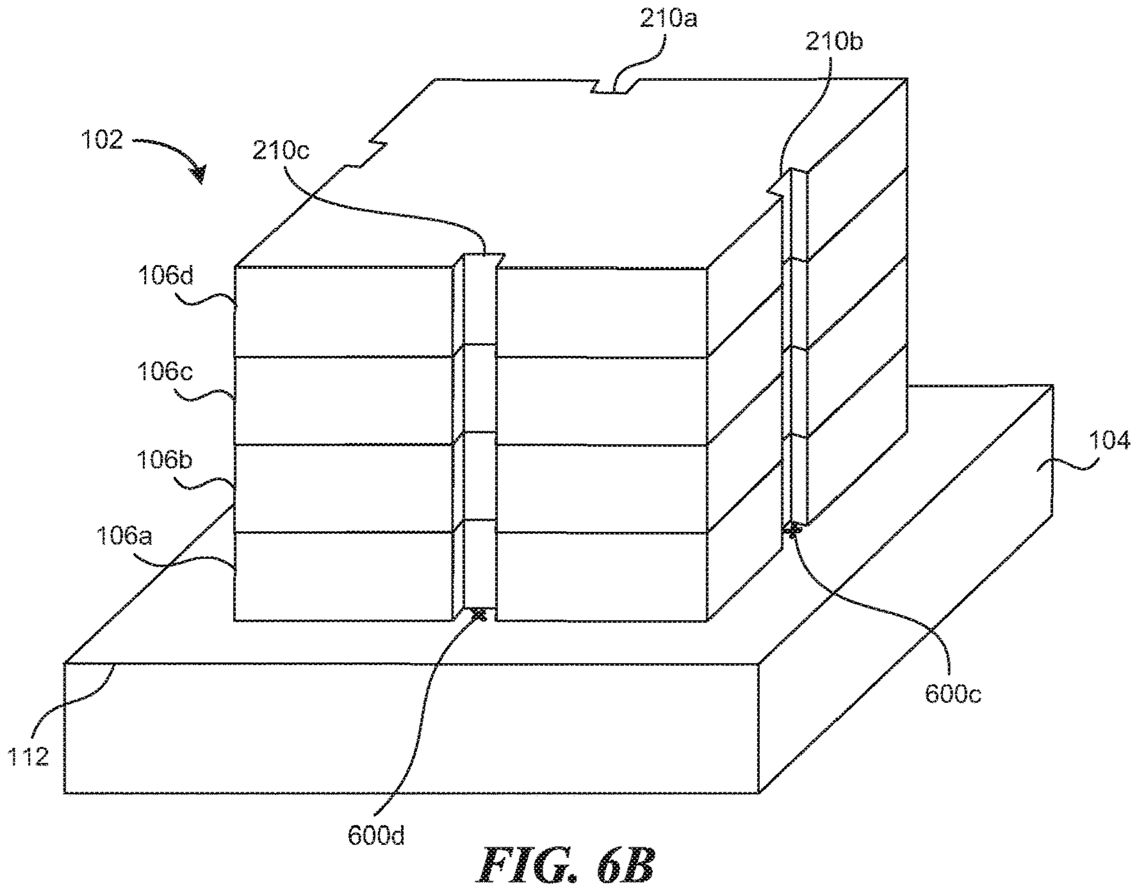

FIGS. 6A and 6B show the die stack 102 that has been aligned with a bottom-most or lower die 106*e* and with the substrate 104, respectively, using one or more alignment structures 600 in accordance with embodiments of the present technology. In other embodiments, a carrier wafer and/or reconstituted wafer can be used as the bottom-most surface. Referring to FIG. 6A, at least one optically visible alignment structure 600*a-b* is provided on the top side 108*e* of the die 106*e*. The alignment structure 600*a* can be scribed on the top side 108*e* and corresponds to a vertical channel formed by the channel 210*b* of the dies 106*a-d*. Similarly, the alignment structure 600*b* can be scribed on the top side 108*e* of die 106*e* and corresponds to the vertical channel formed by the channel 210*c* of the dies 106*a-d*. Turning to FIG. 6B, the alignment structures 600*c-d* are provided on the top surface 112 of the substrate 104. The alignment structures 600*c* and 600*d* correspond to the vertical channels formed by the channels 210*b* and 210*c*, respectively. In other embodiments, the alignment structure 600 can be a feature that is integral with the die 106*e* or substrate 104 that can provide functionality for the die 106 or substrate 104, but that is also optically visible. In further embodiments, the alignment structure 600 can be a component. In some cases, the alignment structure 600 can be smaller than a cross-sectional area of the associated channel 210. In other embodiments, the alignment structure 600 can be a groove, channel, opening, non-linear edge, etc., of a lower die 106.

Although the alignment structures 600 shown in FIGS. 6A and 6B are located proximate the edges 208 of the dies 106, one or more alignment structure 600 can be positioned in an interior region of the die 106, such as to correspond with the channels 210*e-f, k-l* shown in FIGS. 2B, 2E, and 2F. In other embodiments, the two or more adjacent dies 106 and/or one or more die 106 and the substrate 104 can have vertically aligned channels 210 that do not extend through the entire die stack 102 or structure. For example, dies 106*a* and 106*b* can be aligned with an alignment structure 600*b* or 600*d*, while dies 106*c* and 106*d* can be aligned with an alignment structure 600 (not shown) on a top surface of die 106*b*. Other alignment configurations are contemplated and are not limited by the examples described herein.

Figure 7:
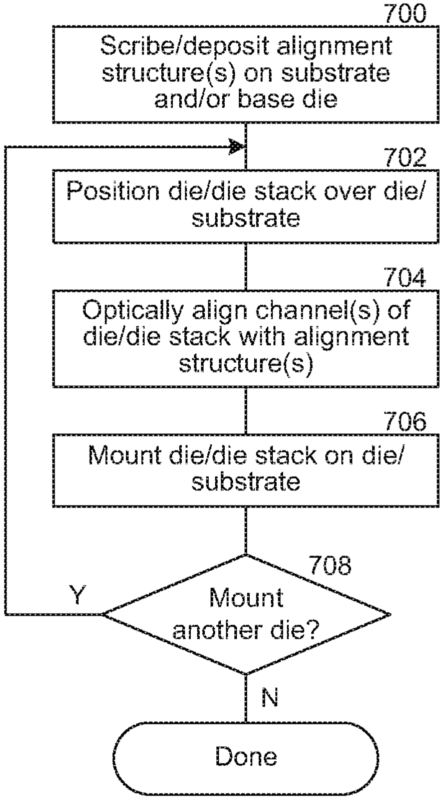
FIG. 7 is a flow chart of a method for using channel(s) and alignment structure(s) to align the dies and/or position one or more dies on the bottom-most die and/or substrate in accordance with embodiments of the present technology.

FIG. 7 is a flow chart of a method for using the channel(s) 210 and alignment structure(s) 600 of the dies 106 and/or substrate 104 to optically align the dies 106 and/or position one or more dies 106 on the substrate 104 in accordance with embodiments of the present technology. The optically visible alignment structure(s) 600 can be scribed, deposited, or otherwise identified on the substrate 104 or lower die 106 (box 700). Similar to the alignment discussed in FIG. 5, the next die 106 to be placed can be picked and positioned and/or repositioned so that the bottom side 110 is over, but not touching, the top side 108 of the lower die 106 or top surface 112 of the substrate 104 (box 702) to expose the alignment structure 600 through the channel 210. In other embodiments, the die stack 102 can be optically aligned, such as over the substrate 104.

The optical alignment tool can be used to optically align one or more channels 210 of the die 106 and/or die stack 102 with the alignment structure(s) 600 of the lower die 106 or the substrate 104 (box 704). The vertical alignment of the channel(s) 210 and the alignment structure(s) 600 can expose the alignment structure(s) 600 during the alignment process. However, it should be understood that in some embodiments the encapsulant 122 can subsequently fill or partially fill the channels 210. Once the die 106/die stack 102 is optically aligned, the die 106/die stack 102 is placed on the die 106 or substrate 104 (box 706). If another die 106 is to be added to the die stack 102 (box 708), the flow returns to box 702, and the next die 106 is positioned over the previous die 106.

In some embodiments, the dies 106 in a die stack 102 can be aligned with each other and/or the substrate 104 using a combination of channels 210 and alignment structures 600. For example, a lower die 106 or die stack 102 can be optically aligned with the substrate 104 using one, two, three or more alignment structures 600 on the substrate 104, and the alignment structures 600 can be located proximate an edge 208 of the die 106 (e.g., as shown in FIG. 6A) and/or interior from the edge 208, such as to correspond with a channel 210 located within the die 106 (e.g., as shown in FIGS. 2B, 2E, and 2F). Also, first and second dies 106 of a die stack 102 can be aligned based on a first channel 210 and the second and third dies 106 can be aligned based on a second channel 210 that is located in a different position than, and is separate from, the first channel 210. In other embodiments, one or more alignment structure(s) 600 can be located on interior dies 106 of a die stack 102. For example, first and second dies 106 of a die stack 102 can be aligned based on a first channel 210 and the second and third dies 106 can be aligned based on an alignment structure 600 that is scribed, deposited, or otherwise identified on the top side 108 of the second die 106. In some cases, each die 106 in the die stack 102 (e.g., dies 106 other than the top die 106) can have an alignment structure on a top side 108 or top surface 112 thereof that is in a different place or location than the other dies 106, such that each of the overlying dies 106 have one or more channel 210 located in a different place. Other combinations are contemplated and are not limited to the examples herein.

Figure 8:
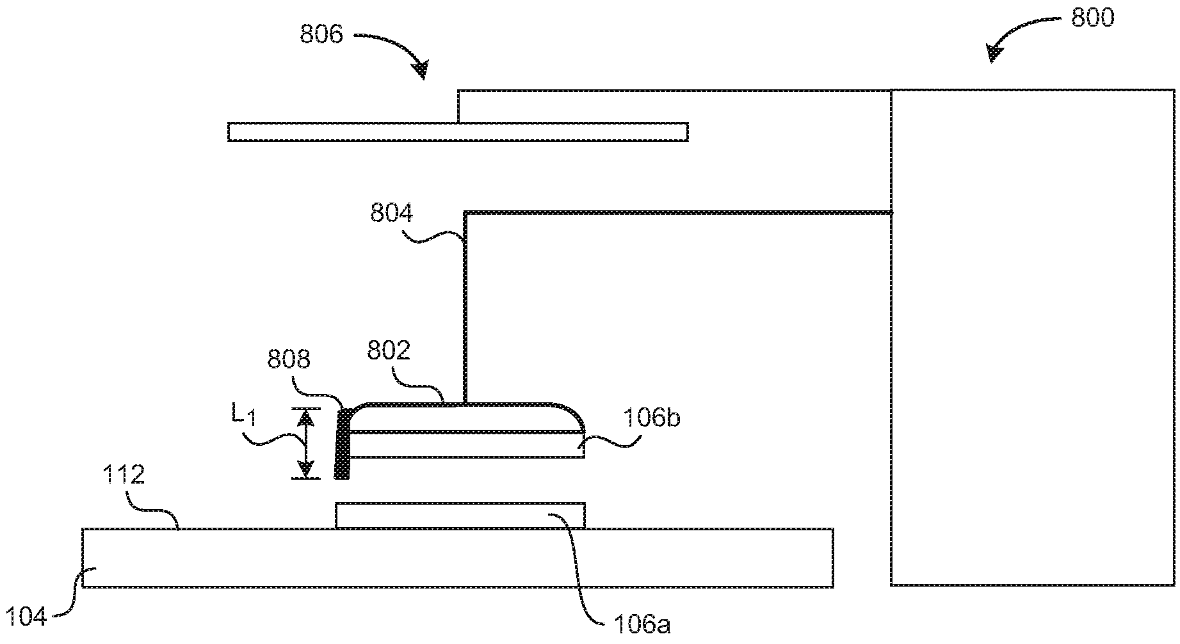
FIG. 8 is a schematic view showing a die placement tool in communication with an optical alignment tool in accordance with embodiments of the present technology.

FIG. 8 is a schematic view showing an example of a die placement tool 800 that uses an optical alignment tool 806 in accordance with embodiments of the present technology.

The die placement tool 800 can use a collet 802 on an arm 804. An optical alignment tool 806, such as a camera or other imaging mechanism, is provided for optical alignment of the dies 106. The optical alignment tool 806 can have a field of view sufficient to image the entire die 106 at the same time, can be moved to image different portions of the die 106 and/or substrate, and/or can view the entirety of the substrate 104. The optical alignment tool 806 can be integral with the collet 802 and arm 804, or can be separate there from, as shown. The optical alignment tool 806 can be in physical communication with a control mechanism (not shown) in the die placement tool 800, separate from the die placement tool 800, and can be controlled by the die placement tool 800 and/or a remotely located controller. In some embodiments, the optical alignment tool 806 is movable to view the alignment structures 600 and channels 210 as needed to ensure proper alignment.

In some embodiments, the collet 802 positions the die 106*a* on the substrate 104 based on the optical alignment of at least one alignment structure 600 on the top surface 112 of the substrate 104 and at least one corresponding channel 210 of the die 106*a* as discussed in FIG. 7. The collet 802 can then pick the die 106*b* and position it over the die 106*a*. The die placement tool 800 uses the optical alignment tool 806 to optically align and/or reposition the channel(s) 210 and/or alignment structure(s) 600 of the die 106*b* with the channel(s) and/or alignment structure(s) 600 of the die 106*a* and/or substrate 104. In some cases, the die placement tool 800 can use information from the optical alignment tool 806 to drive the arm 804 and/or confirm the location of the die 106*b*.

One or more of the channels 210 can be used for mechanical alignment of the dies 106, either together with or separate from the optical alignment. In some embodiments, the die placement tool 800 can include a protrusion 808 that can extend from or be held by the collet 802, or can extend from a different arm (not shown). The protrusion 808 can interface with a unique die edge 208, such as to extend from the top side 108 to the bottom side 110 of the die 106*a* within the recess of the channel 210. The protrusion 808 can have a length L1 sufficient to interface with the number of dies 106 to be aligned. In some cases, the protrusion 808 can be positioned to extend through a channel 210 that is interior with respect to the edges 208, such as the channels 210*e-f, k-l* of FIGS. 2B, 2E, and 2F. The protrusion 808 can be appropriately sized and shaped based on the interfacing channel 210. An advantage can be realized when using the protrusion 808 as the displacement and/or rotation between the die 106 and the collet 802 are known.

Figure 9:
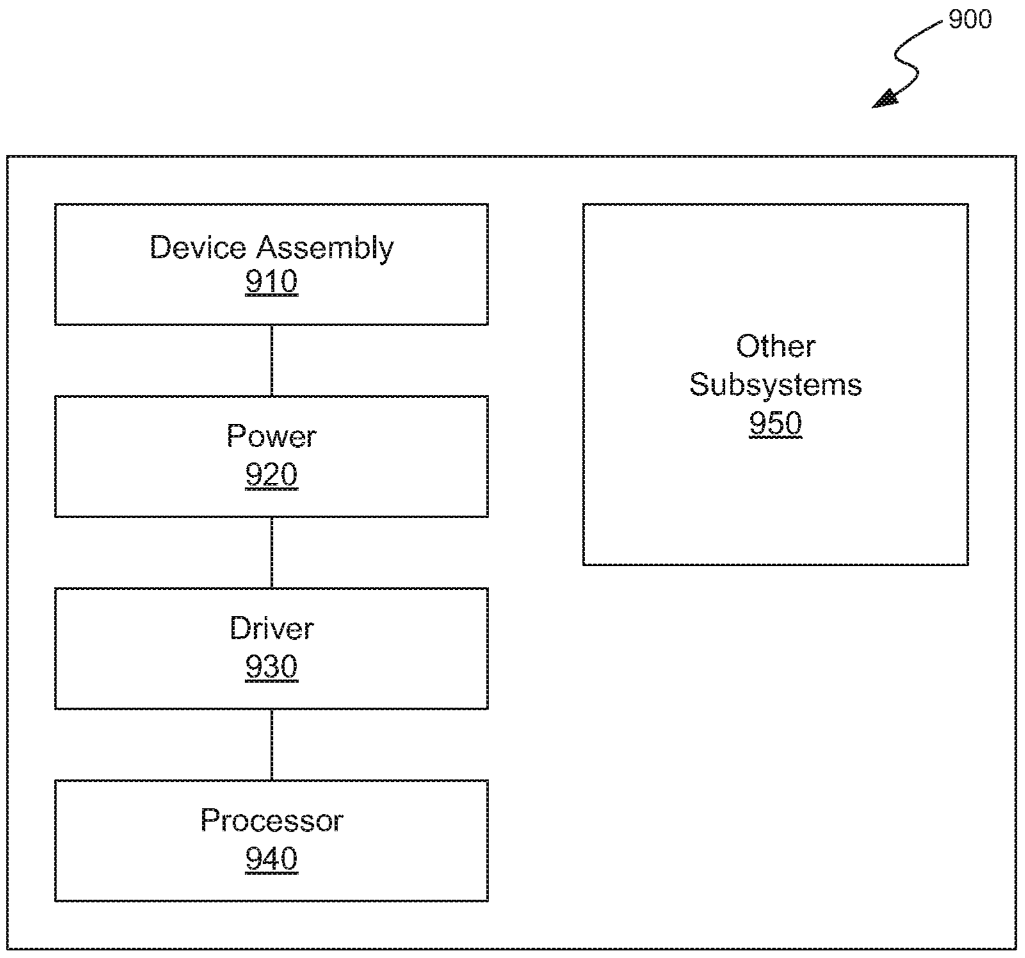
FIG. 9 is a schematic view showing a system that includes a semiconductor device assembly configured in accordance with an embodiment of the present technology.

Any one of the semiconductor devices, assemblies, and/or packages described above with reference to FIGS. 1 through 8 can be incorporated into any of a myriad of larger and/or more complex systems, a representative example of which is system 900 shown schematically in FIG. 9. The system 900 can include a semiconductor device assembly 910, a power source 920, a driver 930, a processor 940, and/or other subsystems or components 950. The semiconductor device assembly 910 can include features generally similar to those of the semiconductor device assemblies described above. The resulting system 900 can perform any of a wide variety of functions such as memory storage, data processing, and/or other suitable functions. Accordingly, representative systems 900 can include, without limitation, hand-held devices (e.g., mobile phones, tablets, digital readers, and digital audio players), computers, vehicle and other machines and appliances. Components of the system 900 may be housed in a single unit or distributed over multiple, interconnected units (e.g., through a communications network). The components of the system 900 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the technology is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A method for aligning semiconductor dies in a die stack, comprising:

providing a first die with a first channel that extends between a top side and a bottom side of the first die;

repositioning the first die relative to a substrate to expose an alignment structure of the substrate through the first channel; and mounting the first die to the substrate.

2. The method of claim 1, wherein the first channel is positioned along a first edge of the first die.

3. The method of claim 1, wherein the first channel is positioned interior with respect to edges of the first die.

4. The method of claim 1, wherein the alignment structure of the substrate is an optically visible mark on a top side of the substrate.

5. The method of claim 1, wherein the alignment structure of the substrate is a second channel extending between a top side and a bottom side of the substrate.

6. The method of claim 5, wherein after mounting the first die to the substrate, the first channel and the second channel are vertically aligned such that they expose a second alignment feature of a lower structure.

7. The method of claim 6, wherein the substrate comprises a second die and the lower structure comprises an additional substrate.

8. The method of claim 1, wherein the repositioning the first die relative to the substrate further comprises exposing a second alignment structure of the substrate with a second channel of the first die that extends between the top side and the bottom side of the first die, the first and second channels being laterally spaced from each other, and wherein the second alignment structure is an optically visible mark on the top side of the substrate.

* * * * *